(12) United States Patent
Kostrzewa et al.

(10) Patent No.: US 7,422,958 B2
(45) Date of Patent: Sep. 9, 2008

(54) METHOD OF FABRICATING A MIXED SUBSTRATE

(75) Inventors: Marek Kostrzewa, Grenoble (FR); Fabrice Letertre, Meylan (FR)

(73) Assignees: S.O.I.Tec Silicon on Insulator Technologies, Bernin (FR); Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/766,463

(22) Filed: Jun. 21, 2007

(65) Prior Publication Data

US 2008/0153251 A1 Jun. 26, 2008

(30) Foreign Application Priority Data

Dec. 26, 2006 (FR) .................................. 06 55950

(51) Int. Cl.
*H01L 21/76* (2006.01)
(52) U.S. Cl. ................. 438/406; 438/118; 438/455; 438/459; 438/692; 257/E21.122
(58) Field of Classification Search ................ 438/118, 438/406, 455, 456, 692, 959, 977, 981; 257/E21.122
See application file for complete search history.

(56) References Cited

U.S. PATENT DOCUMENTS

| | | | | |
|---|---|---|---|---|
| 5,238,865 A | * | 8/1993 | Eguchi | 438/406 |
| 5,691,231 A | | 11/1997 | Kobayashi et al. | 437/62 |
| 6,613,643 B1 | * | 9/2003 | Krishnan et al. | 438/406 |
| 6,846,727 B2 | | 1/2005 | Fogel et al. | 438/479 |
| 6,955,971 B2 | * | 10/2005 | Ghyselen et al. | 438/406 |
| 6,989,314 B2 | | 1/2006 | Rayssac et al. | 438/406 |
| 2002/0079551 A1 | * | 6/2002 | Hokazono | 257/486 |
| 2004/0150067 A1 | * | 8/2004 | Ghyselen et al. | 257/506 |
| 2004/0157404 A1 | | 8/2004 | Park | 438/434 |
| 2004/0166651 A1 | | 8/2004 | Aspar et al. | 438/455 |

FOREIGN PATENT DOCUMENTS

FR 287 6220 4/2006
WO WO 2004/059711 A1 7/2004

* cited by examiner

*Primary Examiner*—George Fourson
*Assistant Examiner*—John M Parker
(74) *Attorney, Agent, or Firm*—Winston & Strawn LLP

(57) ABSTRACT

A method for fabricating a mixed substrate that include insulating material layer portions buried in a substrate of semiconductor material. The method includes providing a support substrate made of semiconductor material and having a front face that includes open cavities; providing a layer of an insulating material upon the front face of the support substrate and into the cavities; polishing the layer to provide a perfectly planar surface; bonding a source substrate to the planar surface of the support substrate; withdrawing a portion of the source substrate to provide an assembly having a thin useful or active layer upon the insulating layer of the support substrate; and heat treating the assembly in a selected atmosphere at a temperature and for a time sufficient to diffuse atoms from the insulating layer and through the thin layer to reduce the thickness of the insulating layer while retaining the insulating material in the cavities of the support substrate.

17 Claims, 3 Drawing Sheets

METHOD OF FABRICATING A MIXED SUBSTRATE

BACKGROUND OF THE INVENTION

The invention relates to a method of producing a mixed substrate, i.e. a substrate which comprises portions of layers of insulating materials buried within a substrate of semiconductor material. Such a substrate may be used to produce both microelectronic components with a buried insulating layer and components without a buried insulating layer.

Interest in mixed substrates is currently increasing. Alternating bulk zones and insulating zones within the same substrate allows different components to be produced on one and the same substrate wafer such as, for example:

on bulk zones: components having an electrical connection between the front and back faces of the substrate, for example components termed "vertical" components;

and on "SeOI (semiconductor on insulator) or "SOI" (silicon on insulator) type zones, components which are completely isolated from each other and isolated from their substrate, for example "MOS" type components or "MEMS" or "MOEMS" type systems.

The acronym "MOS" means "metal oxide semiconductor". The acronyms "MEMS" and "MOEMS" mean "micro electro mechanical systems and "micro-opto-electro-mechanical systems, respectively".

A number of techniques exist for fabricating mixed compounds. In particular, the technique employing the method known by the name of SIMOX may be mentioned. That method consists in implanting oxygen beneath the surface of a silicon substrate, then annealing that substrate at high temperature to convert the oxygen-implanted region into silicon dioxide ($SiO_2$). By way of example, an application of that SIMOX method to the production of mixed substrates is described in U.S. Pat. No. 6,846,727. That method consists in using a mask to implant oxygen ions into the substrate in a localized manner and then to create therein isolated layers of silicon oxide ($SiO_2$) using a suitable heat treatment. However, the surface quality of the mixed substrate obtained is mediocre and non-uniform, due to the increased volume of the SiO2 within the silicon substrate. Further, a large number of defects are also observed in the transition regions between the bulk zones and the SOI type zones.

Furthermore, according to U.S. Pat. No. 6,955,971, a method of fabricating a mixed substrate is known that uses molecular bonding to bring a first substrate comprising insulating zones into contact with a second substrate from which the transferred layer is to be derived. In order for that type of bonding to be of high quality, the surface quality of the substrates to be bonded has to be perfect, i.e., without the slightest defect. Ideally, the bonding interface must not induce any disturbance in future components which will use its junctions. Thus, the surfaces must be carefully prepared prior to bonding using chemical, thermal, plasma, and/or chemical-mechanical polishing treatments, for example.

Polishing is a critical step. However, because the support substrate carries mixed zones, i.e., bulk zones of silicon and insulating zones of silicon oxide, materials which have different natures are not polished at the same rate. Thus, it is difficult for the surface roughness of those two materials to be good on the same substrate.

In practice, after polishing, a difference in the level between the two types of materials, or "dishing", is observed on the surface of the support substrate. This dishing, when it is negative, may be by as much as tens of nanometers, depending on the dimensions of the silicon oxide zones and/or the silicon zones. The negative dishing is principally observed at the silicon zone, as that material is polished more rapidly than the oxide. Because of those surface irregularities, molecular bonding is imperfect and the good quality bonding interface which would be necessary for the subsequent production of good quality components cannot be obtained. Thus, yields are very poor.

To improve the surface planarity of a mixed substrate surface with a view to bonding it and to overcome dishing problems, U.S. Pat. No. 5,691,231 proposes depositing a layer of polycrystalline silicon and polishing it on the substrate after forming and polishing the oxide. However, the electrical properties of a bonding interface between a layer of polycrystalline silicon and a layer of monocrystalline silicon are not sufficient for future components to be fabricated. Further, the presence of a layer of polycrystalline silicon in a substrate requires that the usual component fabrication technologies be further developed or adapted. They were in fact originally developed for substrates comprising a layer of monocrystalline silicon transferred onto an insulating layer. However, a particular mode of preparation of polycrystalline silicon is necessary for direct bonding, both as regards its deposition and its planarization, thereby increasing the number of steps of the fabrication process and also its cost. Finally, inhomogeneities accumulate in the various polishing steps carried out, namely in the first polish of the mixed zones and the second polish of polycrystalline silicon, which has the effect of causing wide variations in the total thickness of the transferred silicon (monocrystalline silicon and polycrystalline silicon).

Finally, International patent application WO-2004/059711 describes a method which consists in bonding two substrates one against the other by molecular bonding, one of those substrates having zones of insulating layers. In order to obtain a good quality bonding interface, impurity traps are created in one of those substrates. Those traps are themselves insulating zones and are disposed so that a short distance exists between two successive insulating zones. Those insulating zones will trap and absorb the impurities which essentially appear during heat treatment applied to strengthen the bonding interface. However, that type of mixed substrate suffers from the disadvantage that the distance between two insulating layer zones must be extremely small so that those zones can act as traps for impurities. Such a method, however, cannot produce mixed substrates with relatively large bulk zones.

In general, it is known that oxide layers present in SOI type substrates can absorb impurities. They are, for example, precipitates of native oxide and/or molecules of gas enclosed when the two substrates are brought into contact, or are already present in those substrates. Those oxide layers can thus indirectly have a good bonding interface without bonding defects, particularly with direct bonding. However, a method of producing mixed substrates by molecular bonding with good quality interfaces despite the absence of insulating layers on certain portions of the support substrate currently does not exist.

Accordingly, the present invention proposes to overcome these difficulties and fill the shortcomings mentioned above by providing improved methods for making such mixed substrates.

SUMMARY OF THE INVENTION

The present invention now provides a method of fabricating a mixed substrate comprising portions of insulating material layers buried in a substrate of semiconductor material.

The method comprises providing a support substrate made of semiconductor material and having a front face that includes open cavities; providing a layer of an insulating material upon the front face of the support substrate and into the cavities; polishing the layer to provide a perfectly planar surface; bonding a source substrate to the planar surface of the support substrate; withdrawing a portion of the source substrate to provide an assembly having a thin useful or active layer upon the insulating layer of the support substrate; and heat treating the assembly in a selected atmosphere at a temperature and for a time sufficient to diffuse atoms from the insulating layer and through the thin layer to reduce the thickness of the insulating layer while retaining the insulating material in the cavities of the support substrate.

The method comprises at least one cycle that includes a first cycle and a second cycle, with the first cycle including forming a first insulating layer onto the front face, and polishing the insulating material layer to conserve only the insulating material inside the open cavities. As the support substrate often includes negative dishing on the front face around the cavities, the second cycle preferably comprises depositing a second insulating layer over the support substrate to fill the negative dishing and form an upper insulating layer, and then polishing the upper insulating layer to form the perfectly planar surface. In this method, the first and second insulating layers may be of the same or different materials.

BRIEF DESCRIPTION OF THE DRAWINGS

Other characteristics and advantages of the invention become apparent from the following description made with reference to the accompanying drawings which, by way of non-limiting indication, illustrate several possible implementations, in which.

DETAILED DESCRIPTION OF THE PREFERRED EMBODIMENTS

Figure 1A:
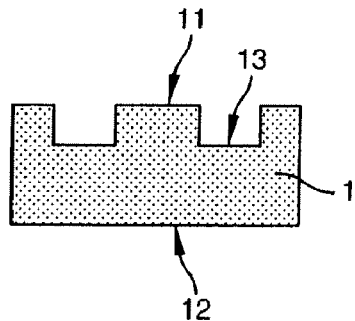
FIGS. 1A to 1G are diagrams representing the successive steps in a first implementation of the method of the invention.

In accordance with a preferred embodiment of the invention, the method comprises the following steps:

a) carrying out at least one cycle consisting in:

forming or depositing an insulating layer on a support substrate formed from a semiconductor material one of the faces of which, termed the "front" face, includes open cavities, in order to fill the cavities with insulating material and to form thereover an insulating layer, termed the "upper layer", that extends over the whole of the front face of the support substrate; then polishing, by chemical-mechanical polishing, at least a portion of the upper insulating layer, the polish which is carried out during the last cycle consisting in obtaining an upper layer of insulator which is thinned to a predetermined thickness and is perfectly planar;

b) bonding, by molecular bonding, a source substrate of semiconductor material onto the thinned insulating layer;

c) withdrawing a portion of the source substrate, termed the "remainder", to obtain a thin layer, termed the "active" layer, with a predetermined thickness on the thinned insulating layer; and d) heat treating the stack of layers obtained in an inert and/or reducing atmosphere, at a predetermined temperature and for a predetermined period, the thicknesses of the thin active layer and of the thinned upper insulating layer, and the temperature and the duration of the heat treatment being selected to cause a portion of the atoms constituting the thinned upper insulating layer to diffuse through the thin active layer of the semiconductor material rather than through the support substrate, thereby reducing the thickness of the thinned upper insulating layer or removing it completely, while conserving the insulating material in the cavities of the support substrate to thereby obtain the mixed substrate.

Further advantageous and non-limiting characteristics of the invention may be used alone or in combination:

the cavities present on the front face of the support substrate are formed by lithography;

the support substrate is constituted by, or is covered with a layer of material the roughness of which is 0.5 nm rms or more for a scan width of 2 μm×2 μm, and the cavities present on the front face of the support substrate are due to that roughness;

the support substrate is constituted by or covered with a surface layer of diamond or aluminum nitride (AlN);

the first cycle for forming or depositing a first insulating layer is carried out, the first insulating layer is polished to conserve only the insulating material inside the open cavities, the support substrate possibly having negative dishing on its front face around the cavities, then a second cycle is carried out to deposit a second insulating layer on the support substrate to fill the negative dishing with the second insulator and to form thereover an upper insulating layer, and the second upper insulating layer is polished to conserve only the predetermined thickness of the upper insulating layer;

the first and second insulators have identical chemical natures;

the first and second insulators have different chemical natures;

the remainder of the source substrate is withdrawn by mechanical and/or chemical thinning;

before the step of bonding by molecular bonding, a zone of weakness is formed inside the source substrate, the zone defining the remainder and the thin active layer;

the zone of weakness is formed by implanting atomic species;

the zone of weakness is formed by a porous layer;

the remainder is detached by applying mechanical, chemical and/or thermal stresses;

the method includes an additional finishing step carried out after the diffusion heat treatment and aimed at reducing the roughness of the thin active layer;

the finishing treatment is selected from at least one of the following treatments: thinning, chemical-mechanical polishing, smoothing annealing, and RTA type rapid heat treatment annealing;

the semiconductor material of the support and source substrates is silicon and the insulator is silicon oxide ($SiO_2$);

the diffusion treatment can diffuse oxygen from the silicon oxide ($SiO_2$) layer through the thin active layer of silicon, and that treatment is carried out at a temperature in the range 1100° C. to 1250° C., preferably close to 1200° C. and for a period of less than 5 hours;

the thickness of the thin active layer of silicon is in the range 5 nm to 500 nm, the thickness of the thinned upper insulating layer is less than 50 nm and the temperature of the diffusion treatment is about 1200° C., the treatment being applied for a period in the range 5 minutes to 5 hours;

the diffusion treatment allows oxygen to diffuse from the silicon oxide (SiO$_2$) layer through the thin active layer of silicon and the thickness of the thin active layer of silicon as well as the duration and temperature of the diffusion treatment are selected in order to produce a mean reduction in the thickness of the layer of silicon oxide SiO$_2$ of at least 0.05 nm per minute.

Referring to FIG. 1A, a support substrate 1 of semiconductor material can be seen wherein one of the faces 11, termed the "front" face, includes open cavities 13. The opposite face of that substrate, termed the "back" face, carries the reference number 12. The substrate 1 may be mono-layered or multi-layered.

The cavities 13 are formed, for example, by lithography, i.e. a technique which consists in selectively etching certain portions of the source substrate through a mask. During this step, a photosensitive resin is spread over the front face of the substrate 1. That resin is then illuminated through a mask. The ultraviolet radiation locally modifies the properties of the resin. Depending on the properties of the resin, which may be positive or negative, the illuminated zones or the non-illuminated zones may be dissolved away by treating the resin with a chemical solution.

Next, chemical and/or dry (plasma assisted etching) etching can be carried out to etch the silicon at regions where it is not protected by residual resin. Under certain etching conditions, in particular to etch deep cavities 13, it is possible to use, in addition, a mask produced from a material such as silicon nitride, for example. The cavities 13 may be etched in a TMAH (tetra-methyl ammonium hydroxide) chemical solution. The material etching rate varies as a function of its crystal orientation. By way of example, an etching rate in the range 0.4 µm/minute to 0.5 µm/min may be obtained for silicon with crystal orientation <1,0,0>. Other types of etching such as RIE (reactive ion etching) type dry etching may also be envisaged.

After etching the cavities 13, the substrate 1 is cleaned in a solvent to eliminate all residues of resin. The depth of the cavities is selected as a function of the applications envisaged for the final substrate; it may vary from a few nanometers to a few micrometers.

Figure 1B:
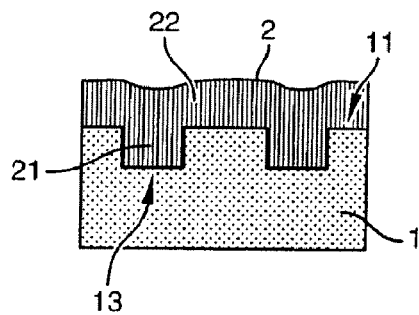

The following step, illustrated in FIG. 1B, consists in forming or depositing an insulating layer 2 on the front face 11 in order to fill the cavities 13 with insulating material and to form a layer of insulating material 22, termed the "upper layer", above the cavities and the front face 11. The upper insulating layer 22 extends over the whole of the front face 11 of the support substrate. The insulating layer in the cavities has reference number 21.

The semiconductor material constituting the source substrate 1 is preferably silicon. With silicon, the insulating layer 2 is preferably a layer of oxide, for example silicon oxide (SiO$_2$), but it may also be a layer of nitride, for example silicon nitride (Si$_3$N$_4$). With a SiO$_2$ type oxide, this may be obtained by heat treating the silicon substrate at a temperature of at least 900° C. This is then denoted a "thermal" oxide. It may also be obtained by LPCVD [low pressure chemical vapor deposition] deposition techniques using TEOS (tetra-ethyl ortho-silicate), for example, as a precursor.

The material constituting the source substrate 1 may also be selected, for example, from: germanium (Ge), silicon germanium (SiGe), gallium arsenide (GaAs), indium phosphide (InP), indium antimonide (InSb) or gallium nitride (GaN). However, it should be noted that if one of the materials in the above list is selected, the insulating layer 2 is then necessarily deposited and constituted by an oxide.

When the insulating layer 2 is formed by deposition techniques, chemical vapor deposition (CVD) may be employed, for example, or low pressure chemical vapor deposition. The deposition is normally carried out in a temperature range of 300° C. to 900° C. Depending on the envisaged application, it is also possible to carry out low temperature deposition, i.e. in the range 120° C. to 300° C.

The insulator 2 may be deposited over the entire surface of the support substrate 1, all at once or, in contrast, in two steps. With two steps, the insulator may initially be deposited in the bottoms of the cavities 13 using a technique known by the skilled person under the acronym LOCOS, and only then is the upper layer 22 formed. The deposition technique known by the acronym "LOCOS" means "local oxidation of silicon".

Figure 1C:
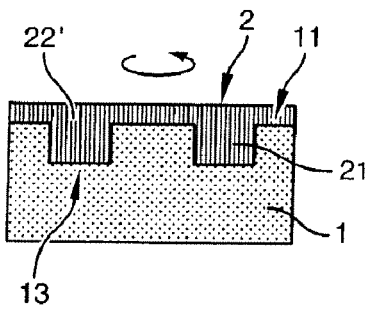

FIG. 1C represents a chemical-mechanical polishing step known as CMP applied to the upper insulating layer 22. Once this layer has been polished, its surface is perfectly planar and of low roughness and it has reduced thickness. It then carries reference number 22'. This thinned upper insulating layer 22' extends over the whole of the front face 11 of the source substrate 1, including that facing the cavities 13 filled with insulating material 21.

The thickness of the thinned upper insulating layer 22' is determined as a function of parameters which are described below. As an example, to fabricate power components, cavities 13 of 0.5 µm to 1 µm in depth are created, for example, filled with insulator, and the thickness of the deposited insulating layer 22 is at least twice that of the depth of the cavity 13, i.e. a thickness of at least 1 µm to 2 µm. After deposition, the insulating layer is not homogeneous and follows the relief of the cavities 13, as shown in FIG. 1B. After polishing, it is brought to a thickness lying in the range about 20 nanometers to 50 nanometers (see reference number 22' in FIG. 1C).

Figure 1D:
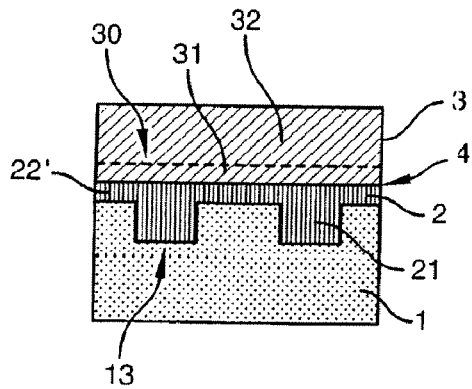

The next step, shown in FIG. 1D, consists in bonding, by molecular bonding, a source substrate 3 of semiconductor material on the thinned insulating layer 22'. At least one of the surfaces to be bonded may be prepared, for example by cleaning, brushing, or plasma treatment, to obtain a good surface quality and good bonding energy. The source substrate 3 is, for example, formed from silicon, and may be doped in different manners and/or have different crystal orientations. The source substrate 3 may also be formed from germanium (Ge), silicon germanium (SiGe), gallium arsenide (GaAs), indium phosphide (InP), indium antimonide (InSb) or gallium nitride (GaN), the choice of source substrate being linked to the final application.

In a first implementation shown in FIG. 1D, the source substrate 3 undergoes a step of implanting atomic species before being bonded to the layer 22'. Preferably, before carrying out the implantation, a layer of oxide is formed thermally or by surface deposition on source substrate 3. It is intended to protect the surface of the semiconductor material during implantation. The thickness of the layer may vary from a few nanometers to a few hundreds of nanometers.

The source substrate 3 is then implanted. Implantation has the effect of forming a zone of weakness 30, which defines a thin layer 31 termed the "active" layer 31 with a predetermined thickness, and the remainder 32 of the substrate. The implantation conditions vary as a function of the thickness of the active layer 31 which is to be transferred. Reference in this regard may be made to the literature concerning the SMART-CUT process. The implantation doses vary from a few $10^{16}$ to a few $10^{17}$ H$^+$ ions/cm$^2$ and the implantation energy varies from 30 keV to 200 keV, also as a function of the thickness of the layer to be obtained. Co-implantation, with hydrogen and helium ions for example, may also be envisaged.

After implantation, the protective oxide is eliminated, for example with a hydrofluoric acid solution (HF). It should be noted that the ions may be implanted through a thin layer of protective oxide, for example a thermal oxide a few nanometers thick, which is conserved even at the moment of bonding. It is thus important, however, that the sum of the thicknesses of this protective oxide and the thinned insulator 22' does not exceed 50 nanometers if the whole of the insulating layer is to be dissolved, as will be described below.

Figure 1E:
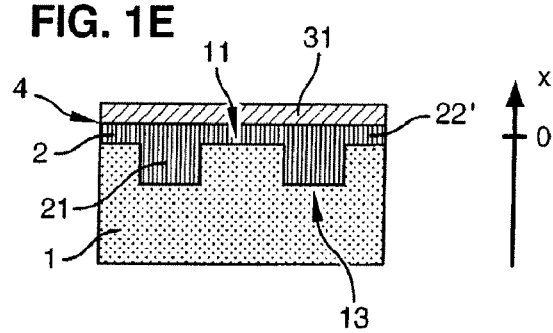

As can be seen in FIG. 1E, a treatment is then carried out to detach the remainder 32. The detachment may be accomplished by applying mechanical, thermal and/or chemical stresses, using techniques which are well known to the skilled person. By way of example, for silicon, detachment heat treatment may be carried out at a temperature of 500° C. for two hours. However, depending on the envisaged application for the final substrate and the desired thickness of the active layer 31, it is possible to modify the duration and temperature of that heat treatment. It is also possible to carry out treatment at a lower temperature for longer. The heat treatment also has the effect of strengthening the bond at the bonding interface 4 between the active layer 31 and the thinned insulating layer 22'.

The layer 31 may also be transferred in other manners. Although not shown in the figures, it is also possible to form the zone of weakness 30 by an ELTRAN® type method consisting in forming a weaker porous layer inside the source substrate 3. Under such circumstances, the remainder 32 is also detached by thermal, mechanical and/or chemical treatments. Finally, it is also possible to remove the remainder 32 by a thinning method such as a BESOI (bonded and etched back silicon on insulator) type method.

Figure 1F:
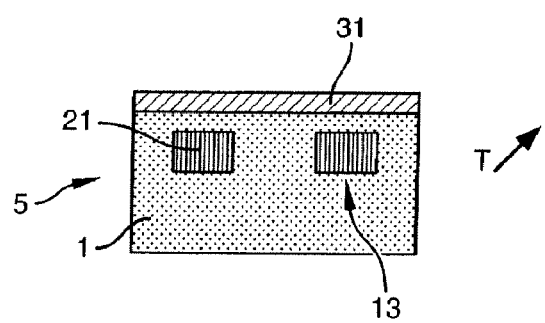

A diffusion dissolution treatment is then carried out, aimed at causing at least a portion of the thinned insulating layer 22' to disappear, see FIG. 1F. To this end, the stack of layers obtained in FIG. 1E then undergoes heat treatment in an inert and/or reducing atmosphere, for example in argon or in hydrogen or in a mixture of the two gases. The heat treatment is carried out within a predetermined temperature range and for a predetermined duration selected, as are the thicknesses of the active layer 31 and the thinned insulating layer 22', in order to cause a portion of the atoms constituting the thinned upper insulating layer 22' to diffuse through the thin active layer 31 rather than through the support substrate 1, so as to remove at least a portion of the layer 22', while conserving the insulating material 21 in the cavities 13 of the support substrate 1. The mixed substrate with reference number 5 was thus obtained (see FIG. 1F). Preferably, the material constituting the support substrate 1 and the insulating material of the layer 22' are selected so that after diffusion of a portion of the atoms constituting the layer 22', the layer 22' is transformed into a material of the same nature as that of the substrate 1.

By way of example, if the support substrate 1 is silicon and the insulating layer 22' is $SiO_2$, after oxygen diffusion, the layer 22' per se of $SiO_2$ disappears and silicon remains in its place which merges with the support substrate 1. When the insulator 2 is a layer of silicon nitride, the dissolution heat treatment has the effect of entraining nitrogen through the active silicon layer 31. The duration and the temperature of the dissolution heat treatment are selected as a function of the thickness of the layers to be dissolved and traversed.

It should be noted that the dissolution anneal, which allows diffusion then evaporation through the active layer of a portion of the atoms from the insulating layer, is accelerated as a function of:

the atmosphere existing close to the substrate surface, the atmosphere preferably being inert and/or reducing;
the thickness of the semiconducting active layer 31; and
the thickness of the thinned insulating layer 22'.

In order to accelerate dissolution, the layer 31 is preferably sufficiently thin, of the order of 5 nanometers to 500 nanometers, and the thinned insulating layer 22' is less than 50 nm thick so as to be completely dissolved.

Experiments to explain the diffusion phenomenon have been carried out for the particular circumstance in which the thin active layer 31 was silicon and the thinned insulating layer 22' was silicon dioxide ($SiO_2$). Those experiments are described below. To illustrate the reduction in the thickness of the oxide 22' due to oxygen diffusion, FIG. 1E shows an axis x which extends perpendicularly to the plane of the layers of substrate, with the origin 0 at the center of the oxide layer 22' and with positive values directed towards the active layer 31 and negative values directed towards the support substrate 1. The substrate of FIG. 1E shows two diffusion domains, namely through the active layer 31 and through the support substrate 1, the two domains being separated by the oxide layer 22 with thickness $d_{ox}$.

Let us assume that oxygen diffuses in one dimension: the diffusion equation is then:

$$\frac{\partial C(x, t)}{\partial t} = D(T) \frac{\partial^2 C(x, t)}{\partial x^2}$$

in which $C(x,t)$ is the concentration of oxygen at time $\underline{t}$ and at point x, and $D(T)$ is the diffusion coefficient of oxygen in the semiconductor material (units: $cm^2/s$). The rate of oxide dissolution corresponds to the difference between the flow of oxygen passing through the active layer 31 and the flow of oxygen passing through the support substrate 1 at the interfaces with the oxide 22'.

If the active layer 31 is sufficiently thin, part of the oxygen from the $SiO_2$ layer 22' diffuses through and evaporates in the atmosphere at its surface. The diffusion is accelerated by the fact that the atmosphere in which the reaction takes place is inert, or more exactly non-oxidizing. In particular, the following reaction occurs at the surface of the active layer 31 of silicon, if the inert atmosphere contains hydrogen:

$SiO_2 + H_2 \rightarrow H_2O + SiO\uparrow$

Since the support substrate 1 is very thick, the oxygen present in the oxide layer 22' cannot reach its free surface, namely the back face 12. However, a certain quantity of oxygen may be present inside the donor substrate 1, and that oxygen diffuses towards the oxide layer 22'. Thus, there is competition between the diffusion through the active layer 31 and the diffusion resulting from displacement of oxygen from the donor substrate 1 towards the layer 22'. However, if the active layer 31 is sufficiently thin and if the atmosphere in which the heat treatment takes place is inert and/or reducing, even if the thickness of the oxide layer 22' temporarily increases slightly because of the supply of oxygen from the substrate 1, typically after a few seconds of treatment, dissolution of the oxygen present in the oxide layer 22' commences, so that the thickness of that layer reduces.

After a certain period, and if the active layer 31 is thin, diffusion of oxygen deriving from the support substrate 1 may be considered to be negligible. Under these conditions, the flow of stabilized oxygen F is such that:

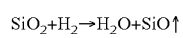

$F = D(T)*C_0(T)/d_{Se}$ $d_{Se}$ being the thickness of the active layer 31 and $C_0(T)$ the solubility of the oxygen to be equilibrated, in the silicon, at the anneal temperature.

The oxide dissolution duration to decrease the oxide layer 22' from a thickness $d_{ox}$ by a predetermined value $\Delta d_{ox}$ is:

$$\text{Duration} = \frac{d_{Se} * \Delta d_{ox}}{D(T) * C(T)} * N$$

in which formula N is the concentration of oxygen atoms in the oxide and C(T) is the solubility coefficient of oxygen in silicon as a function of temperature.

As an example, since the active layer 31 is monocrystalline silicon, then $N=4.22\times 10^{22}$ and if $d_{Se}=100$ nanometers and $\Delta d_{ox}=2$ nanometers, then the duration is $1.86\times 10^{-12}*\exp(4.04 \text{ eV}/kT)$; $k$ represents Boltzmann's constant and T represents the temperature in kelvins.

It has been demonstrated that the principal parameters affecting the dissolution duration are the annealing temperature and the thickness of the active layer 31, and that further, the result does not depend on the concentration of oxygen in the support substrate 1. In general, the temperature and duration of the heat treatment and the thickness of the oxide layer 22' and active layer 31 are selected to cause the oxygen present in the $SiO_2$ to diffuse through the active layer 31 rather than through the support substrate 1, and that treatment is continued until the thinned layer 22' of $SiO_2$ completely or partially disappears. It may be advantageous in certain applications to dissolve the layer of $SiO_2$ 22' only partially, in order to obtain a substrate comprising a layer of buried oxide with different thicknesses.

By way of illustrative example, and on the basis of a digital simulation, the minimum anneal conditions in an atmosphere containing argon or hydrogen which allow dissolution of a 2 nanometer thick layer 22' of $SiO_2$, with an active layer 31 of silicon that is 100 nanometers thick are as follows:

1100° C. for 2 hours; or
1200° C. for 10 minutes; or
1250° C. for 4 minutes.

Further, the thickness of the active layer 31 and the temperature of the heat treatment determine the mean rate of reduction in the thickness of the insulating layer 22'. The thicker the active layer 31, the slower the rate of dissolution. The higher the treatment temperature, the faster the dissolution.

By way of illustrative example, the thickness of the active layer 31 and the temperature may be predetermined to reach a mean rate of reduction of the oxide layer 22' of at least about 0.05 nm per minute. To this end, for a temperature of about 1200° C., the thickness of the silicon layer 31 is selected to be less than 250 nm. It should be emphasized that the dissolution heat treatment also acts to stabilization anneal the structure, or even to have a smoothing effect on the semiconductor layer 31.

Figure 1G:
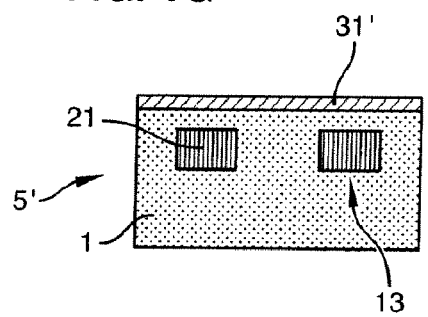

Finally, as shown in FIG. 1G, optionally but preferably, the surface of the active silicon layer 31 undergoes a finishing treatment aimed at reducing its roughness. The polished active layer carries reference number 31' and the mixed substrate then obtained has reference number 5'. As an example, the finishing method may be: thinning, a finishing anneal, for example an RTA (rapid thermal annealing) type smoothing, or chemical-mechanical polishing (CMP). These finishing treatments can produce a low roughness expressed, for example, by a root mean square (rms) value. The roughness measurements may in particular be carried out using an AFM (atomic force microscope). As an example, CMP polishing can produce a final roughness of the order of 0.1 nanometers to 0.5 nanometers rms, for a scanning surface with the tip of the AFM microscope of 2 µm×2 µm, that corresponds to a quality suitable for the fabrication of components.

Figure 2A:
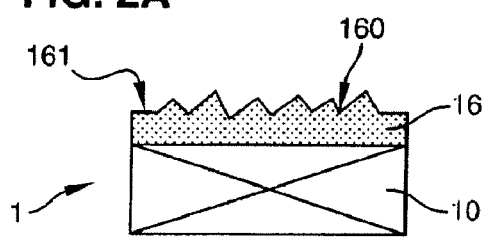
FIGS. 2A to 2G are diagrams representing the successive steps in a first variation of the method of FIG. 1.
Figure 2E:
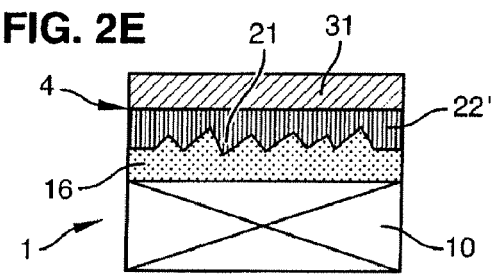
Figure 2B:
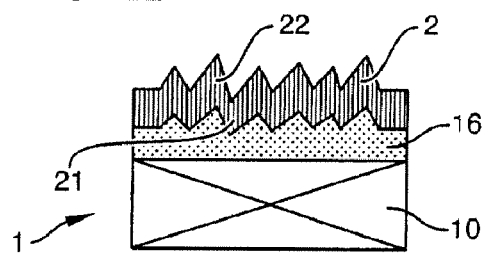
Figure 2F:
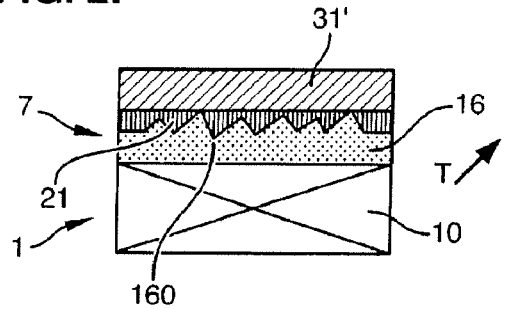
Figure 2C:
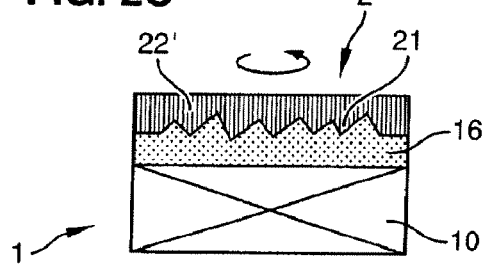
Figure 2G:
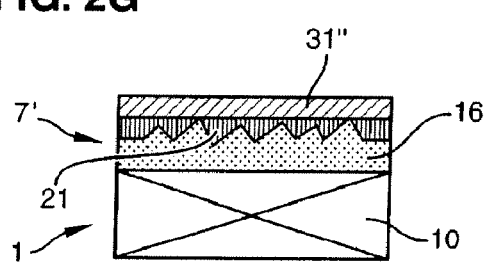
Figure 2D:
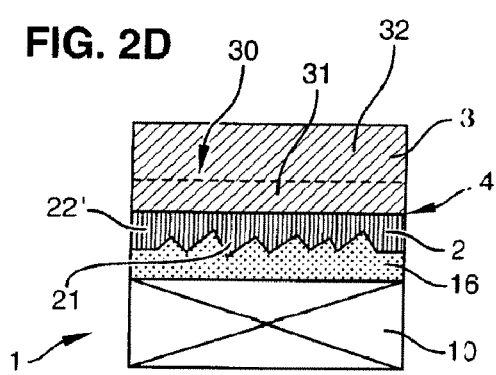

A variation of that first implementation of the method is described below with reference to FIGS. 2A to 2G. This variation consists not in etching the support substrate 1 to form cavities therein, but in using a support substrate initially having very high roughness of more than about 0.5 nanometers rms for a scan width of 2 µm×2 µm by the tip of the AFM microscope. As shown in FIG. 2A, it is also possible to envisage using a support substrate 1 comprising a base substrate 10 covered with a layer 16 of a material with very high roughness, for example diamond or aluminum nitride (AlN). The support substrate 1 is thus multilayered. The rough layer 16 includes open cavities 160 due to irregularities in the surface. The front face of the support substrate has reference number 161.

Various methods have already been developed to obtain that type of high roughness substrate. Reference in this regard can be made to U.S. Pat. No. 6,989,314. The subsequent steps of the method are identical to that described for the method of FIG. 1. The same elements carry the same reference numbers and these steps are not described in detail again. The mixed substrates obtained have respective reference numbers 7 and 7', before or after the finishing treatment.

Figure 3A:
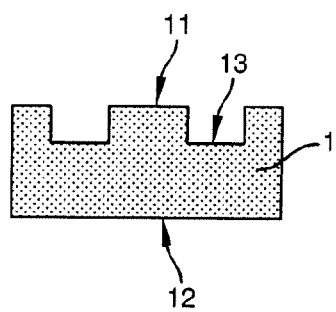
FIGS. 3A to 3I are diagrams representing the successive steps in a second implementation of the method of the invention.
Figure 3B:
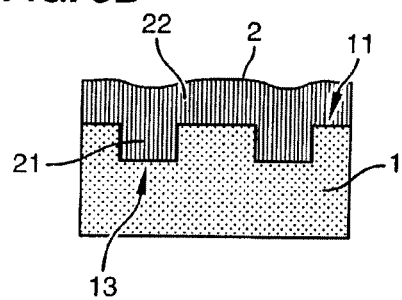

A second implementation of the method of the invention is described below with reference to FIGS. 3A to 3I. This method differs from that shown in FIGS. 1A to 1G in that two cycles are carried out for forming or depositing a layer of insulator and partially polishing the layer. As regards the rest, the same elements carry the same reference numbers. The steps shown in FIGS. 3A and 3B are identical to that which has been described in connection with FIGS. 1A and 1B. These steps will not be described again in detail.

Figure 3C:
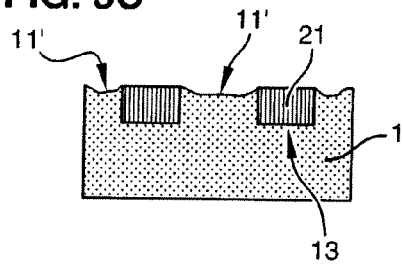

The third step of the method, shown in FIG. 3C, consists in carrying out chemical-mechanical polishing (CMP) of the previously formed or deposited first insulating layer 2. The polishing is continued until the upper layer 22 of the insulating layer 2 has been completely removed and to conserve only the insulating material 21 present inside cavities 13. This causes the appearance of negative dishing at the portions of the front face 11 surrounding the cavities 13. The negative dishing in the front face 11 carries reference number 11'.

Figure 3D:
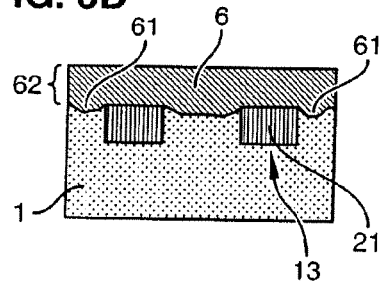
Figure 3E:
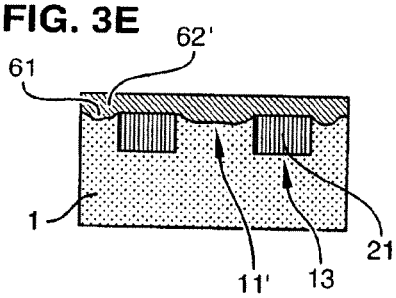
Figure 3F:
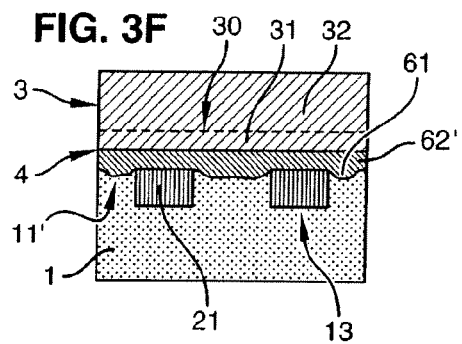
Figure 3G:
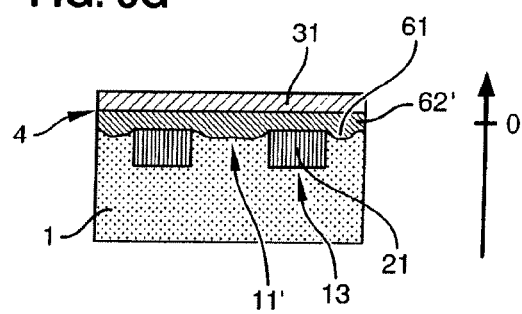

A second cycle consisting in depositing a second insulating layer 6 is then carried out over the whole of the front face of the substrate 1, to catch the surface irregularities and in particular the negative dishing 11'. This step is shown in FIG. 3D. The portion of insulating material 6 which plugs the negative dishing 11' has reference number 61 and the layer which extends over the whole surface of the substrate above these portions 61 and above the cavities 13 filled with insulator 21, has reference number 62. The insulating layer 6 is deposited. It cannot be formed by thermal oxidation, for example, as such oxidation would consume part of the front face 11, 11' of the support substrate 1. As can be seen in FIG. 3E, chemical-mechanical polishing (CMP) is then carried out on the second insulating layer 62 so as to conserve only the thinned insulating layer with reference number 62' with a predetermined thickness.

The step shown in FIG. 3D allows an insulating layer 6 of the same nature as the insulating layer 2 to be deposited, i.e. with the same chemical composition or, in contrast, with a different nature. Advantageously, a layer 2 of $Si_3N_4$ type nitride may be deposited or formed during the first cycle, then an insulating layer 6 of the silicon oxide ($SiO_2$) type may be deposited during the second cycle. The thickness of the second insulating layer 6 deposited varies as a function of the thickness of the insulating layer 22 eliminated during the first polishing cycle, but especially as a function of the negative dishing created during polishing at the substrate 1. The thicker the insulating layer 22 and the more it has to be polished, the greater the resulting negative dishing. An insulating layer 6 of greater or lesser thickness is deposited, the thickness depending on the treatments undergone by the insulating layer 22 and thus indirectly as on the thickness of the layer 22. Hence, it is preferable to deposit an insulating layer 6 of thickness that is at least twice the depth of the negative dishing 11' in order to recover from this dishing.

Figure 3H:
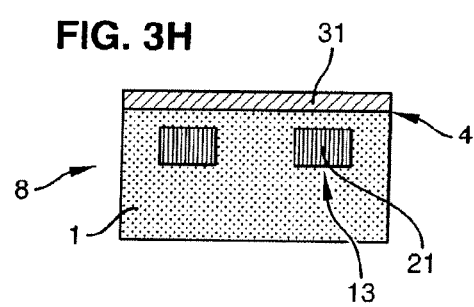
Figure 3I:
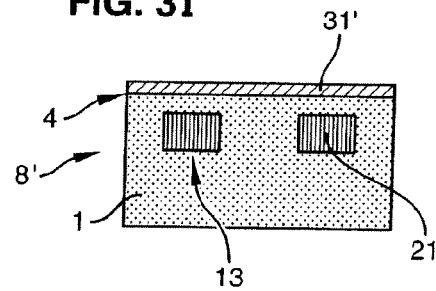

At the end of the steps for transferring the thin layer 31 (see FIGS. 3F and 3G) and diffusion of the insulating portions 61 and layer 62', as shown in FIG. 3H, cavities 13 are obtained which are filled with insulator 21 and isolated in the substrate 1, the negative dishing 11' being filled with semiconductor material (for example silicon) following dissolution of the insulator (for example silicon oxide) at that location. The mixed substrates obtained have respective reference numbers 8 and 8', before and after the finishing treatment (polishing, annealing, etc). In general, regardless of the implementations employed, the above method can produce an active layer 31 or 31' of semiconductor material that may have crystal orientation and/or doping that is/are different from the support substrate 1.

The bonding interface 4 is close to the surface. Thus, it is possible to integrate an n+ doped layer 31 directly onto a support substrate 1 of n– silicon. In that configuration, certain components may be produced without modifying the doping during fabrication, which is useful during diode production. It should be noted that the semiconductor material 31, 31' is preferably of monocrystalline quality so that the components may be made directly on that portion.

Further, the insulating layer 31 may have a crystal orientation that differs from that of the tiles of insulator 21, to obtain substrates with hybrid orientation. This technology is known by the acronym "HOT" (hybrid orientation technology). This technology enables different electronic components (for example, nFET and pFET field effect transistors) to be fabricated on the same substrate, termed "hybrid substrate", having layers or zones with different crystal orientations: silicon (100) and silicon (110), for example.

The method described above is applicable to the formation of any mixed substrate comprising portions of an insulating material, buried in a semiconductor substrate, preferably portions of silicon oxide ($SiO_2$) within a silicon substrate.

What is claimed is:

1. A method of fabricating a mixed substrate comprising insulating material layer portions buried in a substrate of semiconductor material comprising:
   providing a support substrate made of semiconductor material and having a front face that includes open cavities;
   providing a layer of an insulating material upon the front face of the support substrate and into the cavities;
   polishing the layer to provide a planar surface;
   bonding a source substrate to the planar surface of the support substrate;
   withdrawing a portion of the source substrate to provide an assembly having a thin useful or active layer upon the insulating layer of the support substrate; and
   heat treating the assembly in a selected atmosphere at a temperature and for a time sufficient to diffuse atoms from the insulating layer and through the thin layer to reduce the thickness of the insulating layer while retaining the insulating material in the cavities of the support substrate.

2. The method according to claim 1, wherein the cavities on the front face of the support substrate are formed by lithography.

3. The method according to claim 1, wherein the front face of the support substrate has a roughness which is 0.5 nm rms or more for a scan width of 2 µm×2 µm, and the cavities in the front face are due to the roughness.

4. The method according to claim 3, wherein the support substrate either consists of, or is covered with, a surface layer of diamond or aluminum nitride (AlN).

5. The method according to claim 1 wherein the perfectly planar surface is provided by carrying out at least one cycle of forming the insulating layer over the support substrate in order to fill the cavities with an insulating material and to form thereover an upper insulating layer that extends over the whole of the front face of the support substrate.

6. The method according to claim 5, wherein the at least one cycle includes a first cycle and a second cycle, the first cycle forming a first insulating layer onto the front face, polishing the insulating material layer to conserve only the insulating material inside the open cavities, and the support substrate includes negative dishing on the front face around the cavities, with the second cycle depositing a second insulating layer over the support substrate to fill the negative dishing and form an upper insulating layer, and then polishing the upper insulating layer to form the planar surface.

7. The method according to claim 6, wherein the first and second insulating layers are of different materials.

8. The method according to claim 1, wherein the thin layer of the source substrate is provided by mechanical or chemical thinning of the source substrate.

9. The method according to claim 1, which further comprises forming a zone of weakness in the source substrate before bonding to define the thin layer.

10. The method according to claim 9, wherein the zone of weakness is formed by implantation of atomic species or by providing a porous layer in the source substrate.

11. The method according to claim 10, wherein the thin layer is detached by applying mechanical, chemical or thermal stresses to the source substrate or zone of weakness.

12. The method according to claim 1, which further comprises a finishing treatment carried out after the heat treatment for reducing surface roughness of the thin layer.

13. The method according to claim 12, wherein the finishing treatment is a thinning, chemical-mechanical polishing, smoothing anneal, or rapid thermal anneal heat treatment.

14. The method according to claim 1, wherein the semiconductor material of the support substrate and source substrate is silicon and in that the insulating material is silicon oxide ($SiO_2$).

15. The method according to claim 14, wherein the heat treatment is conducted a temperature in the range 1100° C. to 1250° C., for a period of less than 5 hours but sufficient to cause oxygen to diffuse from the $SiO_2$ layer and through the thin layer of silicon.

16. The method according to claim 15, wherein the thin layer of silicon has a thickness is of 5 nm to 500 nm, the insulating layer has a thickness of less than 50 nm, and the temperature of the heat treatment is about 1200° C. for at least 5 minutes.

17. The method according to claim 15, wherein the duration and temperature of the heat treatment are selected in order to produce a mean reduction in the thickness of the layer of $SiO_2$ of at least 0.05 nm per minute.

* * * * *